United States Patent
Mun et al.

(10) Patent No.: US 12,525,537 B2
(45) Date of Patent: Jan. 13, 2026

(54) TRANSISTORS HAVING BACKSIDE CONTACT STRUCTURES

(71) Applicant: GlobalFoundries Singapore Pte. Ltd., Singapore (SG)

(72) Inventors: Bong Woong Mun, Singapore (SG); Athena Jacinto Antonio, Singapore (SG); Jeoung Mo Koo, Singapore (SG)

(73) Assignee: GLOBALFOUNQRIES Singapore Pte. Ltd., Singapore (SG)

( * ) Notice: Subject to any disclaimer, the term of this patent is extended or adjusted under 35 U.S.C. 154(b) by 603 days.

(21) Appl. No.: 18/052,558

(22) Filed: Nov. 3, 2022

(65) Prior Publication Data
US 2024/0153876 A1    May 9, 2024

(51) Int. Cl.
| H01L 23/535 | (2006.01) |
| H01L 23/48 | (2006.01) |
| H01L 23/528 | (2006.01) |
| H10D 84/01 | (2025.01) |
| H10D 84/03 | (2025.01) |

(52) U.S. Cl.
CPC .......... H01L 23/535 (2013.01); H01L 23/481 (2013.01); H01L 23/5286 (2013.01); H10D 84/0149 (2025.01); H10D 84/038 (2025.01)

(58) Field of Classification Search
CPC ............... H10D 30/603; H10D 64/254; H10D 30/0221; H10D 62/378; H10D 10/01; H10D 30/01; H10D 62/124; H10D 64/231; H10D 64/251; H10D 10/00; H10D 30/00; H10D 64/258; H10D 64/281; H10D 64/411; H10D 64/62; H01L 21/743; H01L 21/76898
See application file for complete search history.

(56) References Cited

U.S. PATENT DOCUMENTS

| 6,459,142 B1 | 10/2002 | Tihanyi |
| 9,923,059 B1 | 3/2018 | Tu et al. |
| 10,522,626 B2 | 12/2019 | Goktepeli et al. |
| 2012/0273878 A1 | 11/2012 | Mallikarjunaswamy |

(Continued)

FOREIGN PATENT DOCUMENTS

CN          102157493 A       8/2011

OTHER PUBLICATIONS

D. Prasad et al., "Buried Power Rails and Back-side Power Grids: Arm® CPU Power Delivery Network Design Beyond 5nm," 2019 IEEE International Electron Devices Meeting (IEDM), 2019, pp. 19.1.1-19.1.4, doi: 10.1109/IEDM19573.2019.8993617.

*Primary Examiner* — Fernando L Toledo
*Assistant Examiner* — Adam S Bowen
(74) *Attorney, Agent, or Firm* — Francois Pagette (57) ABSTRACT

A transistor is provided. The transistor includes a substrate, a first diffusion region, a first contact structure, a second diffusion region, a second contact structure, and a gate structure. The first diffusion region is in the substrate. The first contact structure is over the substrate electrically coupling the first diffusion region. The first contact structure includes a first conductive material. The second diffusion region is in the substrate. The second contact structure is in the substrate electrically coupling the second diffusion region. The second contact structure includes a second conductive material different from the first conductive material. The gate structure is between the first contact structure and the second contact structure.

20 Claims, 4 Drawing Sheets

(56) References Cited

U.S. PATENT DOCUMENTS

2014/0357038 A1   12/2014  Shekar
2021/0359132 A1   11/2021  Mun et al.
2023/0378324 A1*  11/2023  Hung ................. H10D 30/0285

* cited by examiner

TRANSISTORS HAVING BACKSIDE CONTACT STRUCTURES

TECHNICAL FIELD

The present disclosure relates generally to semiconductor devices, and more particularly to transistors having backside contact structures and methods of forming the same.

BACKGROUND

Power integrated circuits (ICs) are designed to handle a wide range of power levels and play a crucial role in the conditioning and distribution of power and energy in the world. Power ICs may include various semiconductor devices such as field-effect transistors (FETs), bipolar junction transistors (BJTs), and diodes.

The presence of parasitic components, such as parasitic inductance, capacitance, conductance, and resistance, may combine to attenuate and degrade the electrical performances of the power ICs, leading to lower device efficiency and power losses. It is, therefore, critical to ensure that the parasitic components are kept low, or at least at an acceptable level, for a specific application.

Accordingly, solutions are provided to overcome, or at least ameliorate, the disadvantages described above.

SUMMARY

To achieve the foregoing and other aspects of the present disclosure, transistors having backside contact structures and methods of forming the same are presented.

According to an aspect of the present disclosure, a transistor is provided. The transistor includes a substrate, a first diffusion region, a first contact structure, a second diffusion region, a second contact structure, and a gate structure. The first diffusion region is in the substrate. The first contact structure is over the substrate electrically coupling the first diffusion region. The first contact structure includes a first conductive material. The second diffusion region is in the substrate. The second contact structure is in the substrate electrically coupling the second diffusion region. The second contact structure includes a second conductive material different from the first conductive material. The gate structure is between the first contact structure and the second contact structure.

According to another aspect of the present disclosure, a transistor is provided. The transistor includes a substrate, a first diffusion region, a first contact structure, a second diffusion region, a second contact structure, a gate structure, and an isolation structure. The first diffusion region is in the substrate. The first contact structure is over the substrate electrically coupling the first diffusion region. The first contact structure includes a first conductive material. The second diffusion region is in the substrate. The second contact structure is in the substrate electrically coupling the second diffusion region. The second contact structure includes a second conductive material different from the first conductive material. The gate structure is between the first contact structure and the second contact structure. The isolation structure is in the substrate adjacent to the second contact structure and includes the second conductive material.

According to yet another aspect of the present disclosure, a method of forming a transistor is provided. The method includes forming a first diffusion region and a second diffusion region in a substrate and forming a first contact structure over the substrate to electrically couple the first diffusion region. The first contact structure includes a first conductive material. A second contact structure is formed in the substrate to electrically couple the second diffusion region. The second contact structure includes a second conductive material different from the first conductive material. A gate structure is formed between the first contact structure and the second contact structure.

BRIEF DESCRIPTION OF THE DRAWINGS

The embodiments of the present disclosure will be better understood from a reading of the following detailed description, taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the disclosure.

Additionally, features in the drawings are not necessarily drawn to scale. For example, the dimensions of some of the features in the drawings may be exaggerated relative to other features to help improve the understanding of the embodiments of the disclosure. The same reference numerals in different drawings denote the same features, while similar reference numerals may, but do not necessarily, denote similar features.

DETAILED DESCRIPTION

Transistors having backside contact structures and methods of forming the same are presented. Transistors may include field-effect transistors (FETs) or bipolar junction transistors (BJT). Various embodiments of the present disclosure are now described in detail with accompanying drawings. The various embodiments are disclosed in relation to an asymmetrical FET, for example, an extended-drain metal-oxide-semiconductor (EDMOS) FET. However, it is understood that the present disclosure may be applied to other types of transistors, without departing from the spirit and scope thereof. It is noted that like and corresponding features are referred to by the use of the same reference numerals. The embodiments disclosed herein are exemplary, and not intended to be exhaustive or limiting to the disclosure.

Figure 1:
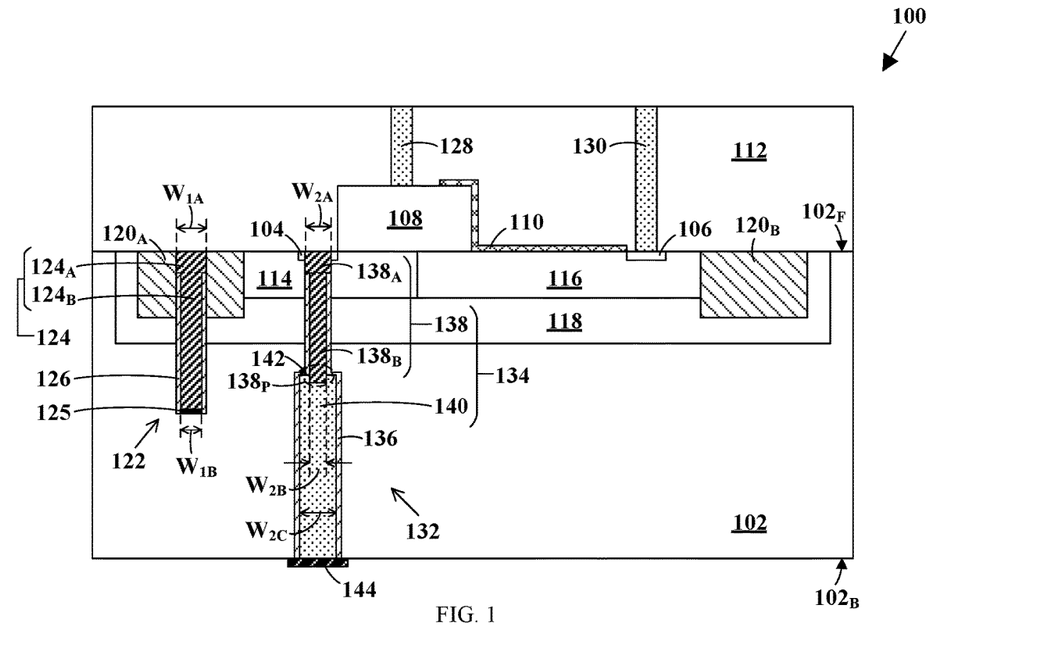
FIG. 1 illustrates a cross-sectional view of a transistor, according to an embodiment of the disclosure.

FIG. 1 illustrates a cross-sectional view of a transistor 100, according to an embodiment of the disclosure. The transistor 100 may include a substrate 102 having a front substrate surface $102_F$ and a back substrate surface $102_B$ opposite the front substrate surface $102_F$. In this embodiment of the disclosure, the substrate 102 is a bulk substrate. The substrate 102 may include a semiconductor material, such as silicon, germanium, silicon germanium, silicon carbide, or other semiconductor compounds, for example, II-VI or III-V semiconductor compounds. The substrate 102 may have an amorphous, polycrystalline, or monocrystalline structure.

The transistor 100 may include a diffusion region 104, a diffusion region 106, and a gate structure 108 between the diffusion region 104 and the diffusion region 106. The diffusion region 104 and the diffusion region 106 may be arranged at least partially in the substrate 102. For example, as illustrated in FIG. 1, the diffusion region 104 and the diffusion region 106 may be arranged in the substrate 102, extending downwardly from the front substrate surface $102_F$ towards the back substrate surface $102_B$. Alternatively, the diffusion region 104 and the diffusion region 106 may extend over the front substrate surface $102_F$, even though this embodiment is not illustrated.

Although the diffusion region 104 and the diffusion region 106 are illustrated to have the same size and shape, it is understood that the size and shape of the diffusion region 104 and the diffusion region 106 may vary depending on the technology node and design requirements of the transistor 100. In an embodiment of the disclosure, the diffusion region 104 may provide a source region and the diffusion region 106 may provide a drain region for the transistor 100. In another embodiment of the disclosure, the diffusion region 104 may provide a drain region and the diffusion region 106 may provide a source region for the transistor 100.

The gate structure 108 may be arranged on the front substrate surface $102_F$. Alternatively, the gate structure 108 may include a portion thereof in substrate 102, and another portion thereof over the front substrate surface $102_F$, even though this embodiment is not illustrated. Additionally, the gate structure 108 may be centered between the diffusion region 104 and the diffusion region 106, or the gate structure 108 may be arranged proximate to either the diffusion region 104 or the diffusion region 106, for example, the gate structure 108 is being arranged nearer to the diffusion region 104 than to the diffusion region 106 as illustrated in FIG. 1. The gate structure 108 may include a plurality of elements, for example, a gate dielectric layer over the substrate 102, a gate electrode over a gate dielectric layer, and spacers on at least the sidewalls of the gate electrode, and these elements are not shown so as to not obscure the present disclosure.

An insulating layer 110 may be arranged on a portion of the gate structure 108 that is proximate to the diffusion region 106. The insulating layer 110 may be conformal and may overlap a portion of an upper surface and a side surface of the gate structure 108 and further laterally extend over the front substrate surface $102_F$ to at least the edge of the diffusion region 106. The insulating layer 110 may be a single-layered dielectric material or a multi-layered dielectric material. For example, where the insulating layer 110 is single-layered, the insulating layer 110 may include silicon oxide. In another example, where the insulating layer 110 is multi-layered, the insulating layer 110 may include a silicon nitride layer arranged between two layers of silicon oxide. In an embodiment of the disclosure, the insulating layer 110 may serve to prevent salicidation of the substrate 102 between the gate structure 108 and the diffusion region 106.

A dielectric layer 112 may be arranged over the front substrate surface $102_F$, covering at least the gate structure 108 and the insulating layer 110. The dielectric layer 112 may be referred to as a pre-metal dielectric (PMD) layer. The dielectric layer 112 may include an electrically insulative material, for example, silicon oxide, carbon-doped silicon oxide, tetraethoxysilane (TEOS), borophosphosilicate glass (BPSG), undoped silicate glass (USG), or amorphous silicon.

The substrate 102 may include a doped well 114 having the diffusion region 104 arranged therein and a doped well 116 having the diffusion region 106 arranged therein. The doped well 114 and the doped well 116 may extend downwardly from the front substrate surface $102_F$ towards the back substrate surface $102_B$. The doped well 114 may be arranged adjacent to the doped well 116 with adjoining edges. Alternatively, the doped well 114 may be arranged within the doped well 116 or be spaced apart from the doped well 116. These alternative embodiments are not illustrated in the accompanying drawings.

The doped well 114 and the doped well 116 may have opposite conductivities. For example, the doped well 114 may have n-type conductivity and the doped well 116 may have p-type conductivity or vice versa. The designation of "n-type" or "p-type" is based upon the type of dopant present, for example, in the doped well 114 and the doped well 116. N-type conductivity dopants may include arsenic, phosphorus, or antimony, and p-type conductivity dopants may include boron, aluminum, or gallium.

The doped well 114 and the doped well 116 may or may not have the same dopant depth and dopant concentration. The dopant concentrations and/or dopant depths, for example, may vary depending on the technology node and design requirements of the transistor 100. In an embodiment of the disclosure, the doped well 114 has the same conductivity type as the diffusion region 104 and the diffusion region 106, though not necessarily including the same type of dopant. In another embodiment of the disclosure, the doped well 114 has a lower dopant concentration than either the diffusion region 104 or the diffusion region 106.

The substrate 102 may further include a conductivity well 118. The conductivity well 118 may provide a conductive pathway in the substrate 102, and the doped well 114 and the doped well 116 may be arranged therein. The conductivity well 118 may extend downwardly from the front substrate surface $102_F$ towards the back substrate surface $102_B$. The conductivity well 118 and the doped well 114 may have the same conductivity, though not necessarily including the same type of dopant. The conductivity well 118 may also have a lower dopant concentration than either the doped well 114 or the doped well 116.

Isolation structures $120_A$ and $120_B$ may be arranged in the substrate 102. The isolation structures $120_A$ and $120_B$ may extend downwardly from the front substrate surface $102_F$ towards the back substrate surface $102_B$. The isolation structures $120_A$ and $120_B$ may be arranged within the conductivity well 118, as illustrated in FIG. 1. Alternatively, the isolation structures $120_A$ and $120_B$ may extend through the conductivity well 118. The isolation structures $120_A$ and $120_B$ may be arranged adjacent to the doped well 114 and the doped well 116, respectively, with corresponding adjoining edges. In an embodiment of the disclosure, the isolation structures $120_A$ and $120_B$ may be connected and surround the transistor 100. The isolation structures $120_A$ and $120_B$ may include an electrically insulative material, for example, silicon oxide, silicon nitride, silicon oxynitride, or a combination thereof.

Another isolation structure 122 may be arranged through at least one of the isolation structures $120_A$ and $120_B$, for example, the isolation structure 122 is arranged through the isolation structure $120_A$ as illustrated in FIG. 1. The isolation structure 122 may extend downwardly from the front substrate surface $102_F$ towards the back substrate surface $102_B$. The isolation structure 122 may have a deeper depth relative to the isolation structure 120 with respect to the front substrate surface $102_F$ and may be referred to as a deep trench isolation (DTI) structure. Accordingly, the isolation structure 120 having a shallower depth relative to the isolation structure 122 may be referred to as a shallow trench isolation (STI) structure. The isolation structure 122 may terminate within the substrate 102 such that the bottom end of the isolation structure 122 may be spaced from the back substrate surface $102_B$ by a portion of the substrate 102 vertically underneath the isolation structure 122.

The isolation structure 122 may include a conductive core 124 and an isolation liner 126. The conductive core 124 may include an upper portion $124_A$ and a lower portion $124_B$, the interface between the upper portion $124_A$ and the lower portion $124_B$ is diagrammatically shown by a dashed line for purposes of illustration. The upper portion $124_A$ may have a width $W_{1A}$ extending between opposite sidewalls that are in contact with the isolation structure $120_A$ and the lower portion $124_B$ may have a width $W_{1B}$ narrower than the width $W_{1A}$. The isolation liner 126 may partially surround the lower portion $124_B$ of the conductive core 124, and the opposite sidewalls of the lower portion $124_B$ may be in contact with the isolation liner 126. The isolation liner 126 may include an electrically insulative material, for example, silicon oxide, silicon nitride, silicon oxynitride, or a combination thereof.

The upper portion $124_A$ of the conductive core 124 may have a surface substantially coplanar with the front substrate surface $102_F$. The conductive core 124 may include an electrically conductive material, for example, a semiconductor material such as polycrystalline silicon. Alternatively, the electrically conductive material may also include a non-semiconductor material, for example, copper or tungsten.

The isolation structure 122 may also include an ohmic contact 125. The ohmic contact 125 may be a doped region in the base of the conductive core 124 and serves as a substrate grounding terminal. In an embodiment of the disclosure, the ohmic contact 125 may include the same conductivity as the substrate 102. In another embodiment of the disclosure, the ohmic contact 125 may include p-type conductivity dopants, for example, boron.

The transistor 100 may further include a contact structure 128 and a contact structure 130 arranged in the dielectric layer 112. The contact structure 128 may be electrically coupled to the gate structure 108 and may be referred to as a gate terminal. The contact structure 130 may be electrically coupled to the diffusion region 106 and provide a diffusion terminal thereof. As used herein, when an element is referred to as being "connected" or "coupled" to another element, the element can be directly connected or coupled to the other element or intervening elements may be present. In contrast, when an element is referred to as being "directly connected" or "directly coupled" to another element, there are no intervening elements present. The contact structure 128 and the contact structure 130 may include an electrically conductive material, for example, copper or tungsten.

The contact structure 128 and the contact structure 130 may include one or more liners, although the liners are not illustrated in FIG. 1. For example, the liners may include an adhesion liner and/or a barrier liner. The adhesion liner may include a metal silicide, for example, titanium silicide or nickel silicide. The barrier liner may include a metal nitride, for example, titanium nitride or tantalum nitride.

Another contact structure 132 may be electrically coupled to the diffusion region 104 and provide a diffusion terminal thereof. The contact structure 132 may be arranged through the substrate 102 and extend in an opposite direction from the contact structure 128 and the contact structure 130 with respect to the front substrate surface $102_F$. For example, the contact structure 132 may extend between the front substrate surface $102_F$ and the back substrate surface $102_B$, through the diffusion region 104, the doped well 114, the conductivity well 118, and the substrate 102. In another example, the contact structure 132 may have a surface substantially coplanar with the front substrate surface $102_F$ and another surface substantially coplanar with the back substrate surface $102_B$.

The contact structure 132 may include a conductive core 134 and a dielectric liner 136. The conductive core 134 may include a semiconductor core portion 138 and a metallic core portion 140. The semiconductor core portion 138 may be in direct contact with the metallic core portion 140. In an embodiment of the disclosure, the semiconductor core portion 138 may include a pillar portion $138_P$ extending into the metallic core portion 140.

The semiconductor core portion 138 may be arranged vertically over the metallic core portion 140. The semiconductor core portion 138 may extend from the front substrate surface $102_F$ towards the back substrate surface $102_B$ and may terminate in the substrate 102, as illustrated in FIG. 1, or the conductivity well 118. The semiconductor core portion 138 may include an upper portion $138_A$ and a lower portion $138_B$; the interface between the upper portion $138_A$ and the lower portion $138_B$ is diagrammatically shown by a dashed line for purposes of illustration. The upper portion $138_A$ may have a width $W_{2A}$ extending between opposite sidewalls that are in contact with the doped well 114 and the lower portion $138_B$ may have a width $W_{2B}$ narrower than the width $W_{2A}$. The dielectric liner 136 may surround the lower portion $138_B$, and the opposite sidewalls of the lower portion $138_B$ may be in contact with the dielectric liner 136. In an embodiment of the disclosure, the width $W_{2A}$ of the semiconductor core portion 138 may be at most as wide as the width $W_{1A}$ of the isolation structure 122.

The metallic core portion 140 may be arranged vertically underneath the semiconductor core portion 138. The metallic core portion 140 may extend from the back substrate surface $102_B$ towards the semiconductor core portion 138. The metallic core portion 140 may have a width $W_{2C}$ extending between opposite sidewalls, and the width $W_{2C}$ may be at most as wide as the width $W_{2A}$ of the semiconductor core portion 138. In an embodiment of the disclosure, the width $W_{2C}$ may be wider than the width $W_{2A}$.

The conductive core 134 may include a stepped surface 142. The stepped surface 142 may be a lateral extension of the metallic core portion 140 under the semiconductor core portion 138. For example, the width $W_{2B}$ of the semiconductor core portion 138 may be wider than the width $W_{2C}$ of the metallic core portion 140, and accordingly, the stepped surface 142 may also be referred to as the upper surface of the metallic core portion 140. In another example, the sidewall of the semiconductor core portion 138 may be arranged at an inward offset from the sidewall of the metallic core portion 140, and the stepped surface 142 may connect the sidewall of the metallic core portion 140 to the sidewall of the semiconductor core portion 138. In an embodiment of the disclosure, the stepped surface 142 may be substantially parallel with either the front substrate surface $102_F$ or the back substrate surface $102_B$.

The dielectric liner 136 may further overlay the stepped surface 142. The dielectric liner 136 may include an electrically insulative material, for example, silicon oxide, silicon nitride, silicon oxynitride, or a combination thereof. In an embodiment of the disclosure, the dielectric liner 136 may include the same electrically insulative material as the isolation liner 126. In another embodiment of the disclosure, the dielectric liner 136 may include a different electrically insulative material from the isolation liner 126.

The semiconductor core portion 138 may include a semiconductor material, for example, polycrystalline silicon. The semiconductor material may be doped or undoped. In an embodiment of the disclosure, the semiconductor core portion 138 may include the same semiconductor material as the conductive core 124 of the isolation structure 122. In another embodiment of the disclosure, the semiconductor core portion 138 may include a different semiconductor material from the conductive core 124 of the isolation structure 122.

The metallic core portion 140 may include a metallic material, for example, copper or tungsten. In an embodiment of the disclosure, the metallic core portion 140 may include the same conductive material as the contact structure 128 or the contact structure 130. In another embodiment of the disclosure, the metallic core portion 140 may include a different conductive material from either the contact structure 128 or the contact structure 130.

A contact pad 144 may be arranged on the back substrate surface $102_B$, electrically coupling the contact structure 132. The contact pad 144 may include an electrically conductive material, for example, copper, aluminum, or tungsten. The contact pad 144 may serve as an external terminal to the diffusion region 104 through the contact structure 132.

The contact structures 128 and 130 may provide a frontside interconnect system, while the contact structure 132 may provide a backside interconnect system, and any parasitic capacitance resulting between the contact structures 128, 130, and 132 is advantageously minimized. Additionally, the contact pad 144 may eliminate long interconnect routing to the diffusion region 104 and thereby reducing the parasitic resistance of the transistor 100.

Figure 2:
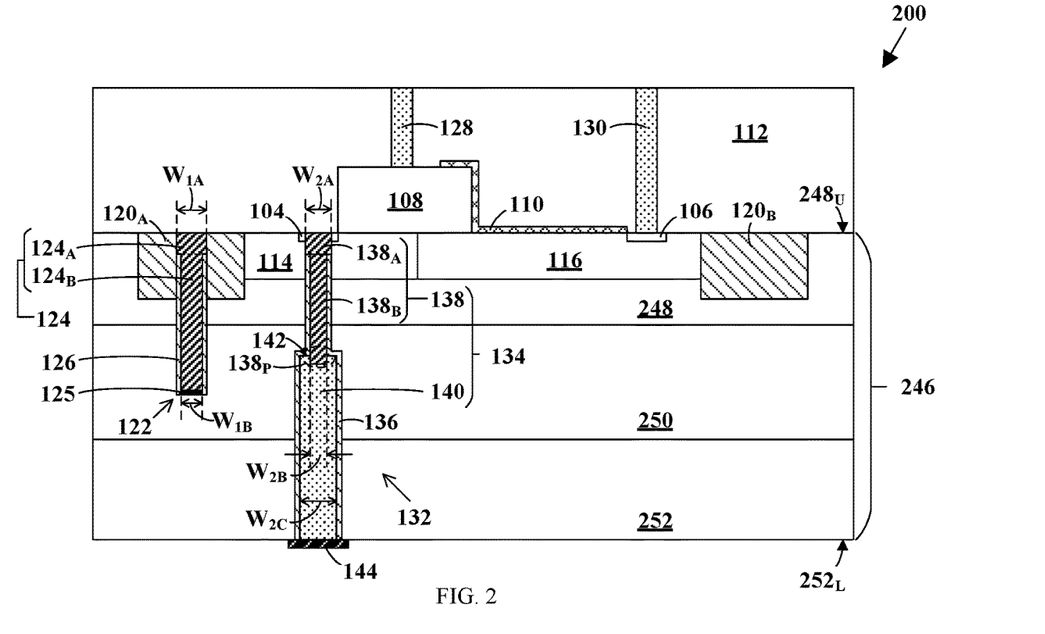
FIG. 2 illustrates a cross-sectional view of a transistor, according to an alternative embodiment of the disclosure.

FIG. 2 illustrates a cross-sectional view of a transistor 200, according to another embodiment of the disclosure. The transistor 200 may be similar to the transistor 100 in FIG. 1, and thus common features are labeled with the same reference numerals and need not be discussed. Unlike the transistor 100 which includes a bulk substrate, the transistor 200 may include a composite substrate 246, for example, a semiconductor-on-insulator (SOI) substrate having a semiconductor layer 248, a buried insulator layer 250 under the semiconductor layer 248, and a bulk layer 252 under the buried insulator layer 250.

The semiconductor layer 248 may also be referred to as a device layer or an active layer of the transistor 200, which may be synonymous with the conductivity well 118 of the transistor 100 in FIG. 1. The doped well 114, the doped well 116, and the isolation structure 120 may be arranged in the semiconductor layer 248. The semiconductor layer 248 has an upper surface $248_U$, which may be synonymous with a front substrate surface of the substrate 246. The semiconductor layer 248 may include a monocrystalline semiconductor material, for example, silicon, silicon germanium, silicon carbon, other II-VI or III-V semiconductor compounds, and the like.

The buried insulator layer 250 may serve to at least electrically isolate the semiconductor layer 248 from the bulk layer 252. The buried insulator layer 250 may include a dielectric material, for example, silicon oxide, and may also be referred to as a buried oxide (BOX) layer.

The bulk layer 252 has a lower surface $252_L$, which may be synonymous with a back substrate surface of the substrate 246. The bulk layer 252 may include a semiconductor material, for example, silicon, silicon germanium, silicon carbon, other II-VI or III-V semiconductor compounds, and the like.

The isolation structure 122 may terminate within the buried insulator layer 250, as illustrated in FIG. 2, or the isolation structure 122 may extend through the buried insulator layer 250 and terminate within the bulk layer 252.

The contact structure 132 may be arranged through the substrate 102 and extend in an opposite direction from the contact structure 128 and the contact structure 130 that may be arranged over the semiconductor layer 248 of the substrate 246. For example, the contact structure 132 may extend through the doped well 114, the semiconductor layer 248, the buried insulator layer 250, and the bulk layer 252.

The semiconductor core portion 138 of the conductive core 134 may be arranged vertically over the metallic core portion 140 and the metallic core portion 140 may extend through the bulk layer 252. The semiconductor core portion 138 may be arranged at least partially through the semiconductor layer 248. For example, as illustrated in FIG. 2, the semiconductor core portion 138 may extend through the semiconductor layer 248 and terminate within the buried insulator layer 250, and the stepped surface 142 of the conductive core 134 may be arranged in the buried insulator layer 250. In another example, the semiconductor core portion 138 may terminate within the semiconductor layer 248, and accordingly, the stepped surface 142 of the conductive core 134 may be arranged in the semiconductor layer 248.

FIGS. 3A to 3E are cross-sectional views of the transistor 100 in FIG. 1, illustrating a method of forming thereof, according to an embodiment of the disclosure. Certain structures may be conventionally fabricated, for example, using known processes and techniques, and specifically disclosed processes and methods may be used to achieve individual aspects of the present disclosure.

Figure 3A:
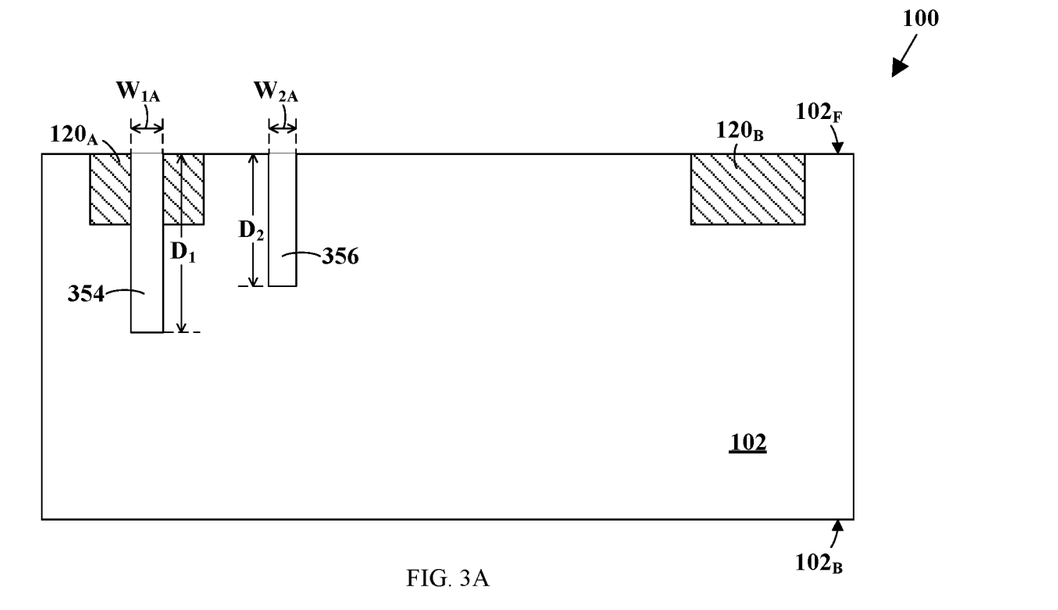
FIGS. 3A to 3F are cross-sectional views of the transistor in FIG. 1, illustrating a method of forming thereof, according to an embodiment of the disclosure.

FIG. 3A illustrates the transistor 100 at an initial fabrication stage of a processing method, according to an embodiment of the disclosure. The transistor 100 may include a substrate 102 having a front substrate surface $102_F$ and a back substrate surface $102_B$ opposite the front substrate surface $102_F$. The front substrate surface $102_F$ may be where semiconductor components, for example, active devices and passive devices that may be arranged adjacent to, in, and/or above the substrate 102.

Isolation structures $120_A$ and $120_B$ may be formed in the substrate 102. The isolation structures $120_A$ and $120_B$ may connect and define a boundary within which a semiconductor device may be formed. The isolation structures $120_A$ and $120_B$ may be formed using a patterning technique, including lithography and etching processes, to form trenches (not shown) in the substrate 102, and filling the trenches with a dielectric material using a deposition technique, including a chemical vapor deposition process. The isolation structures $120_A$ and $120_B$ may include an electrically insulative material, for example, silicon oxide, silicon nitride, silicon oxynitride, or a combination thereof.

Subsequently, an isolation opening 354 and a contact opening 356 may be formed in the substrate 102 extending downwardly from the front substrate surface $102_F$. The isolation opening 354 and the contact opening 356 may each have a deeper depth than the isolation structures $120_A$ and $120_B$. The isolation opening 354 and the contact opening 356 may be formed using a patterning technique, including lithography and etching processes. The isolation opening 354 may be formed through at least one of the isolation structures $120_A$ and $120_B$, for example, the isolation opening 354 may be formed through the isolation structure $120_A$ and the contact opening 356 may be formed adjacent thereto, spaced apart from the isolation structure $120_A$.

The isolation opening 354 has a width $W_{1A}$ and a depth $D_1$ with respect to the front substrate surface $102_F$. The contact opening 356 has a width $W_{2A}$, the width $W_{2A}$ may be at most as wide as the width $W_{1A}$, and a depth $D_2$ with respect to the front substrate surface $102_F$. In an embodiment of the disclosure, the isolation opening 354 may be a trench and the contact opening 356 may be a via opening. In an embodiment of the disclosure, the width $W_{1A}$ of the isolation opening 354 may be no wider than 2 micrometers (μm). In another embodiment of the disclosure, the width $W_{2A}$ of the contact opening 356 may be at least 1 μm.

As illustrated in FIG. 3A, the width $W_{2A}$ of the contact opening 356 may be narrower than the width $W_{1A}$ of the isolation opening 354. Consequently, because of the narrower width, the depth $D_2$ of the contact opening 356 may be shallower than the depth $D_1$ of the isolation opening 354 with respect to the front substrate surface $102_F$ due to a microloading effect of the etching process, where fewer chemicals, for example, etchants, reach the bottom of the isolation opening 354 and the contact opening 356, causing the etch rate to decrease. In another embodiment of the disclosure, the width $W_{1A}$ of the isolation opening 354 may be substantially equal to the width $W_{2A}$ of the contact opening 356. Accordingly, the depth $D_1$ of the isolation opening 354 may be substantially equal to the depth $D_2$ of the contact opening 356 with respect to the front substrate surface $102_F$.

Figure 3B:
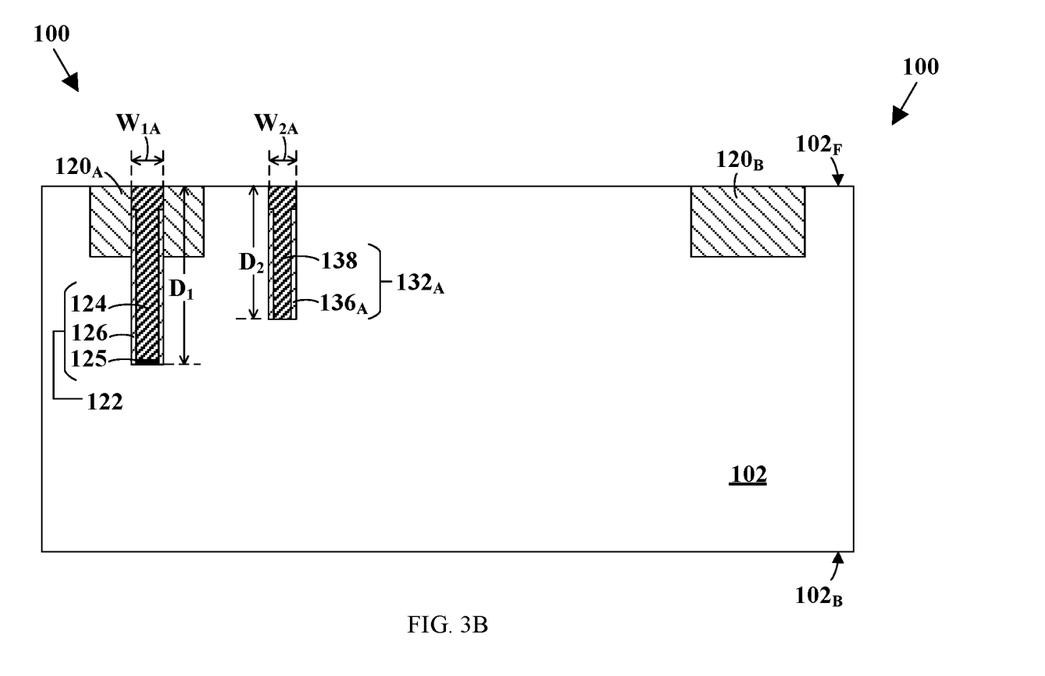

FIG. 3B illustrates the transistor 100 at a fabrication stage subsequent to FIG. 3A, according to an embodiment of the disclosure. An isolation structure 122 may be formed in the isolation opening 354 and a contact structure $132_A$ may be formed in the contact opening 356. The isolation structure 122 may include a conductive core 124 and an isolation liner 126, and the contact structure $132_A$ may include a semiconductor core portion 138 and a dielectric liner $136_A$.

An exemplary process to form the isolation structure 122 and the contact structure $132_A$ is described herein. A layer of dielectric material may be deposited in the isolation opening 354 and the contact opening 356 using a deposition technique, including a chemical vapor deposition (CVD) process. The deposition technique may enable a conformal deposition of the dielectric material along the respective side surfaces and the bases of the isolation opening 354 and the contact opening 356, and also over the front substrate surface $102_F$.

The dielectric material may be patterned using a patterning technique, including lithography and etching processes to concurrently form the isolation liner 126 in the isolation opening 354 and the dielectric liner $136_A$ in the contact opening 356, exposing a portion of the substrate 102 in the isolation opening 354 and the contact opening 356. The isolation liner 126 and the dielectric liner $136_A$ may be recessed to a level under the front substrate surface $102_F$. The dielectric material may include an electrically insulative material, for example, silicon oxide, silicon nitride, silicon oxynitride, or a combination thereof. Even though the isolation liner 126 and the dielectric liner $136_A$ are described as being formed concurrently, the isolation liner 126 and the dielectric liner $136_A$ may, alternatively, be formed using separate processing steps. In an embodiment of the disclosure, the isolation liner 126 and the dielectric liner $136_A$ may to recessed to the same level under the front substrate surface $102_F$.

Subsequently, an electrically conductive material may be deposited to at least fill the isolation opening 354 and the contact opening 356 to form the conductive core 124 and the semiconductor core portion 138 therein, respectively. The electrically conductive material may be deposited using a deposition technique, including a CVD process. The electrically conductive material may overfill the isolation opening 354 and the contact opening 356, and a planarization technique, including a chemical mechanical planarization (CMP) process, may be employed such that the conductive core 124 and the semiconductor core portion 138 may each achieve a substantially planar upper surface, and the planar upper surfaces may be substantially coplanar with the front substrate surface $102_F$.

The electrically conductive material may include a semiconductor material, for example, polycrystalline silicon. The electrically conductive material may also include a non-semiconductor material, for example, copper or tungsten. Even though the conductive core 124 and the semiconductor core portion 138 are described as being formed concurrently, the conductive core 124 and the semiconductor core portion 138 may, alternatively, be formed using separate processing steps. An ohmic contact 125 may be formed in the base of the conductive core 124 by introducing dopants therein using a doping technique, including an ion implantation process.

As mentioned earlier, the isolation liner 126 and the dielectric liner $136_A$ may be recessed to a level under the front substrate surface $102_F$. Accordingly, the upper portions of the semiconductor core portion 138 of the contact structure 132 may be in contact with the substrate and may be electrically coupled to a conductivity well 118 that will be formed in subsequent processing steps.

Figure 3C:
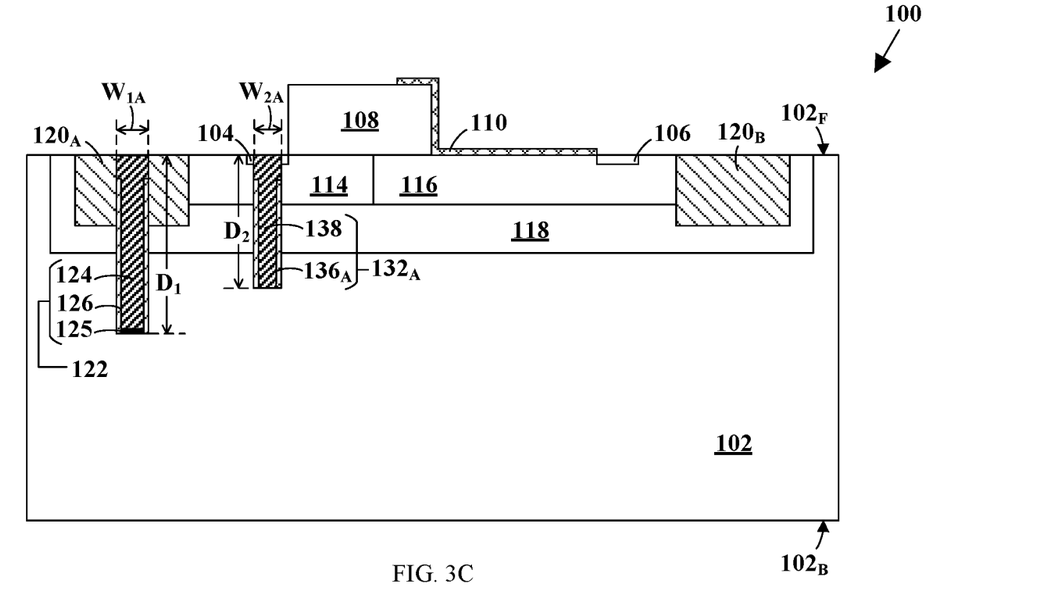

FIG. 3C illustrates the transistor 100 at a fabrication stage subsequent to FIG. 3B, according to an embodiment of the disclosure. A plurality of elements may be formed in and over the substrate 102. For example, a conductivity well 118, a doped well 114, a doped well 116, a diffusion region 104, and a diffusion region 106 may be formed in the substrate 102, extending downwardly from the front substrate surface $102_F$, and a gate structure 108 and an insulating layer 110 may be formed over the substrate 102.

An exemplary process to form the conductivity well 118, the doped well 114, the doped well 116, the diffusion region 104, and the diffusion region 106 is described herein. Dopants having a desired conductivity type may be introduced into the substrate 102 to form the conductivity well 118, the doped well 114, the doped well 116, the diffusion region 104, and the diffusion region 106. At least a portion of the doped well 114 may be formed in an upper part of the semiconductor core portion 138, such that the doped well 114 may be electrically coupled thereto. The dopants may be introduced using a doping technique, including an ion implantation process. The conductivity well 118, the doped well 114, the diffusion region 104, and the diffusion region 106 may have the same conductivity, for example, n-type conductivity, though not necessarily having the same type of dopant, while the doped well 116 may have different conductivity, for example, p-type conductivity.

The conductivity well 118 may have a depth relatively deeper than either the doped well 114 or the doped well 116 with respect to the front substrate surface $102_F$. The doped well 114 and the doped well 116 may have a depth relatively deeper than either the diffusion region 104 or the diffusion region 106 with respect to the front substrate surface $102_F$. The dopant concentrations and/or dopant depths may vary depending on the technology node and design requirements for the transistor 100. In an embodiment of the disclosure, the doped well 114 and the doped well 116 may each have a dopant concentration higher than that of the conductivity well 118 but lower than that of the diffusion region 104 and the diffusion region 106.

An exemplary process to form the gate structure 108 and the insulating layer 110 is described herein. The gate structure 108 may include a gate dielectric layer, a gate electrode, and spacers, even though these elements are not shown in the accompanying drawings. A layer of gate dielectric material may be deposited over the front substrate surface $102_F$, and a layer of gate electrode material may be deposited over the layer of gate dielectric material using a deposition technique, including a CVD process. The layer of gate dielectric material and the layer of gate electrode material may be patterned using a patterning technique, including lithography and etching processes, to form the gate dielectric layer and the gate electrode, respectively. The layer of gate dielectric material and the layer of gate electrode material may be patterned in a single processing step or multiple processing steps. A layer of spacer material may be deposited over at the gate electrode using a deposition technique and patterned using a patterning technique to form the spacers on at least the sidewalls of the gate electrode.

Subsequently, an insulating material may be formed over the front substrate surface $102_F$, covering the gate structure 108 using a deposition technique. The deposition technique may enable a conformal deposition of the insulating material. The insulating material may be patterned using a patterning technique to form the insulating layer 110. The insulating layer 110 may overlap a portion of the upper surface and the side surface of the gate structure 108 and laterally extend over the front substrate surface $102_F$ towards the diffusion region 106. The insulating material may include silicon oxide and/or silicon nitride.

Figure 3D:
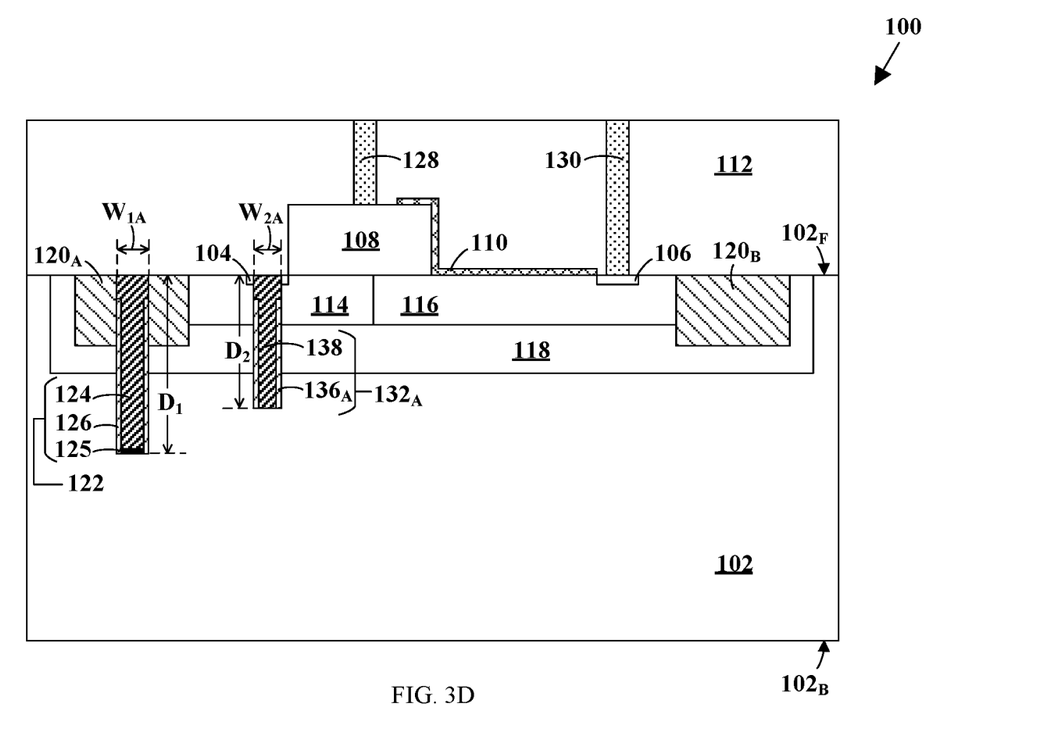

FIG. 3D illustrates the transistor 100 at a fabrication stage subsequent to FIG. 3C, according to an embodiment of the disclosure. A dielectric layer 112 may be formed over the front substrate surface $102_F$, covering the gate structure 108 and the insulating layer 110, using a deposition technique. The dielectric layer 112 may be referred to as a PMD layer. Openings (not shown) may be formed in the dielectric layer 112 using a patterning technique and an electrically conductive material may be formed therein using a deposition technique to form a contact structure 128 and a contact structure 130. The contact structure 128 may be a gate terminal and the contact structure 130 may be a diffusion terminal.

Figure 3E:
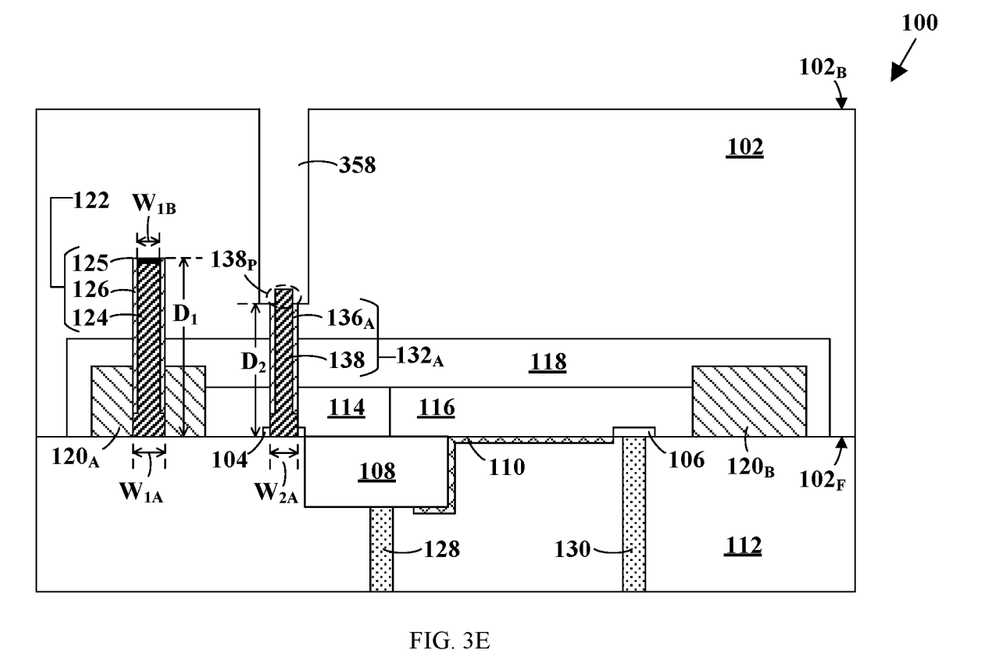

FIG. 3E illustrates the transistor 100 at a fabrication stage subsequent to FIG. 3D, according to an embodiment of the disclosure. The substrate 102 may undergo a backside grinding process to thin down its thickness before the subsequent processing steps. In an embodiment of the disclosure, the substrate 102 may have a thickness of about 50 μm to about 100 μm after the backside grinding process.

The transistor 100 may be inverted for the ease of subsequent processing. For example, the back substrate surface $102_B$ may be over the front substrate surface $102_F$. A contact opening 358 may be formed in the substrate 102 over the contact structure $132_A$. The contact opening 358 may have a width at least as wide as the width $W_{2A}$ of the contact structure $132_A$. It may be advantageous for the contact opening 358 to have a wider width than the contact structure $132_A$ for ease of processing and also to achieve lower electrical resistance of the eventual contact structure 132. The contact opening 358 may extend from the back substrate surface $102_B$ towards the contact structure $132_A$ and a pillar portion $138_P$ of the semiconductor core portion 138 may extend into the contact opening 358. In an embodiment of the disclosure, the contact opening 358 may be a via opening. In another embodiment of the disclosure, the opening may be a trench.

Figure 3F:
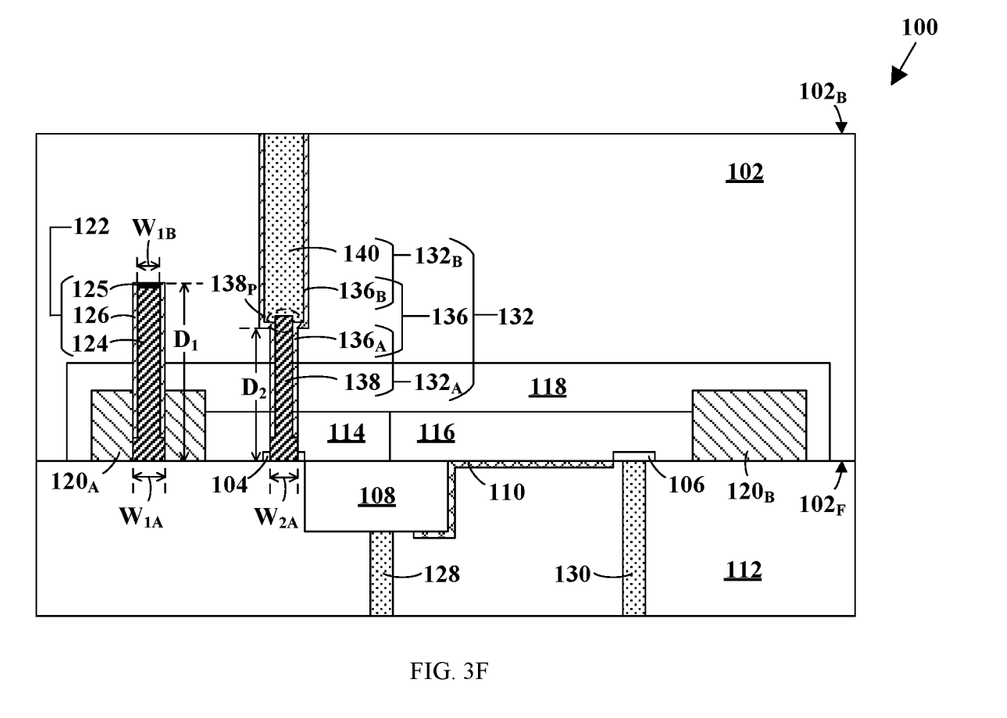

FIG. 3F illustrates the transistor 100 at a fabrication stage subsequent to FIG. 3E, according to an embodiment of the disclosure. A contact structure $132_B$ may be formed in the contact opening 358. The contact structure $132_B$ may include a dielectric liner $136_B$ and a metallic core portion 140.

A layer of dielectric material may be conformally deposited in the contact opening 358 using a deposition technique. Preferably, the layer of dielectric material may be deposited to a thickness greater than the eventual thickness of the dielectric liner $136_B$. A material-removal technique, including an isotropic etching process, may be employed to thin down the thickness of the layer of dielectric material to form the dielectric liner $136_B$ in the contact opening 358, exposing at least a part of the pillar portion $138_P$ of the semiconductor core portion 138. Even though FIG. 3F illustrates the dielectric liner $136_B$ having a substantially equal thickness as the dielectric liner $136_A$, the dielectric liner $136_B$ may be thicker or thinner than the dielectric liner $136_A$. The dielectric liner $136_A$ and the dielectric liner $136_B$ collectively form the dielectric liner 136.

Subsequently, an electrically conductive material may be deposited to substantially fill the contact opening 358 using a deposition technique to form a metallic core portion 140 having a surface substantially coplanar with the back substrate surface $102_B$. The metallic core portion 140 may be in contact with the pillar portion $138_P$ of the semiconductor core portion 138. The contact structure $132_A$, the contact structure $132_B$, and the dielectric liner 136 collectively form a contact structure 132 for the transistor 100.

Processing continues with the formation of a contact pad 144 over the back substrate surface $102_B$. A layer of electrically conductive material may be deposited over the back substrate surface $102_B$ using a deposition technique and patterning using a patterning technique to form the contact pad 144 over the contact structure 132. The contact pad 144 may be at least electrically coupled to the contact structure 132. The electrically conductive material may include copper or tungsten.

The terms "top", "bottom", "over", "under", and the like in the description and the claims, if any, are used for descriptive purposes and not necessarily for describing permanent relative positions. It is to be understood that the terms so used are interchangeable under appropriate circumstances such that the embodiments of the devices described herein are, for example, capable of operation in other orientations than those illustrated or otherwise described herein.

Additionally, the formation of a first feature over or on a second feature in the description that follows may include embodiments in which the first and second features are formed in direct contact, and may also include embodiments in which additional features may be formed interposing the first and second features, such that the first and second features may not be in direct contact.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of features is not necessarily limited to those features but may include other features not expressly listed or inherent to such process, method, article, or device. Occurrences of the phrase "in an embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

Furthermore, approximating language, as used herein throughout the specification and claims, may be applied to modify any quantitative representation that could permissibly vary without resulting in a change in the basic function to which it is related. Accordingly, a value modified by a term or terms, such as "approximately", "about", or "substantially" is not limited to the precise value specified. In some instances, the approximating language may correspond to the precision of an instrument for measuring the value. In other instances, the approximating language may correspond to within normal tolerances of the semiconductor industry. For example, "substantially coplanar" means substantially in a same plane within normal tolerances of the semiconductor industry, and "substantially perpendicular" means at an angle of 90 degrees plus or minus a normal tolerance of the semiconductor industry.

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of features and methods of fabrication described in an exemplary embodiment without departing from the scope of this disclosure as set forth in the appended claims.

What is claimed is:

1. A transistor, comprising:
   a substrate;
   a first diffusion region in the substrate;
   a first contact structure over the substrate electrically coupling the first diffusion region, the first contact structure including a first conductive material;
   a second diffusion region in the substrate;
   a second contact structure in the substrate electrically coupling the second diffusion region, the second contact structure including a conductive core comprising a second conductive material different from the first conductive material and a third conductive material different from the second conductive material; and
   a gate structure between the first contact structure and the second contact structure.

2. The transistor of claim 1, wherein the substrate comprises:
   a front substrate surface; and
   a back substrate surface, and the second contact structure extends between the front substrate surface and the back substrate surface.

3. The transistor of claim 2, wherein the second contact structure comprises:
   a dielectric liner partially surrounding the conductive core.

4. The transistor of claim 3, wherein the conductive core comprises:
   a first portion comprising the second conductive material; and
   a second portion under the first portion, the second portion comprises the third conductive material.

5. The transistor of claim 4, wherein the second conductive material is a semiconductor material.

6. The transistor of claim 5, wherein the semiconductor material is polycrystalline silicon.

7. The transistor of claim 4, wherein the third conductive material comprises the same conductive material as the first conductive material.

8. The transistor of claim 4, wherein the second portion of the conductive core comprises a surface substantially coplanar with the back substrate surface.

9. The transistor of claim 4, wherein the first portion of the conductive core has a first width, the second portion of the conductive core has a second width, and the second width is wider than the first width.

10. The transistor of claim 4, wherein the substrate is a composite substrate comprising:
    a semiconductor layer;
    a buried insulator layer under the semiconductor layer; and
    a bulk layer under the buried insulator layer, and the first portion of the conductive core extends through the semiconductor layer and terminates within the buried insulator layer.

11. The transistor of claim 4, further comprising:
    a conductivity well in the substrate, and the first portion of the conductive core extends through the conductivity well.

12. A transistor, comprising:
    a substrate;
    a first diffusion region in the substrate;
    a first contact structure over the substrate electrically coupling the first diffusion region, the first contact structure including a first conductive material;
    a second diffusion region in the substrate;
    a second contact structure in the substrate electrically coupling the second diffusion region, the second contact structure including a second conductive material different from the first conductive material and a third conductive material;
    a gate structure between the first contact structure and the second contact structure; and
    an isolation structure in the substrate adjacent to the second contact structure, the isolation structure comprises the second conductive material.

13. The transistor of claim 12, wherein the isolation structure further comprises an isolation liner partially surrounding the second conductive material.

14. The transistor of claim 13, wherein the second contact structure comprises:
    a conductive core comprising:
      a first portion including the second conductive material; and
      a second portion under the first portion including the third conductive material; and
    a dielectric liner partially surrounding the conductive core, and the dielectric liner comprises the same material as the isolation liner.

15. The transistor of claim 14, wherein the substrate has a front substrate surface, the isolation structure has a first depth relative to the front substrate surface and the first portion of the conductive core has a second depth shallower than the first depth.

16. The transistor of claim 15, wherein the isolation structure has a first width, and the first portion of the conductive core has a second width narrower than the first width.

17. A method of forming a transistor, comprising:
    forming a first diffusion region and a second diffusion region in a substrate;

forming a first contact structure over the substrate to electrically couple the first diffusion region, the first contact structure comprising a first conductive material;

forming a second contact structure in the substrate to electrically couple the second diffusion region, the second contact structure including a conductive core comprising a second conductive material different from the first conductive material and a third conductive material different from the second conductive material; and forming a gate structure between the first contact structure and the second contact structure.

18. The method of claim 17, wherein forming the second contact structure comprises:

forming a first portion of the second contact structure in the substrate, extending downwardly from a front substrate surface towards a back substrate surface and terminating within the substrate;

inverting the substrate such that the back substrate surface is over the front substrate surface; and forming a second portion of the second contact structure extending through the remaining portion of the substrate.

19. The method of claim 18, further comprising:

forming an isolation structure in the substrate adjacent to the second contact structure, wherein the isolation structure is formed concurrently with the first portion of the second contact structure.

20. The method of claim 19, wherein forming the isolation structure and the first portion of the second contact structure comprises:

forming an isolation opening and a contact opening in the substrate that terminate within the substrate;

depositing a conformal layer of dielectric material in the isolation opening and the contact opening;

recessing the conformal layer of dielectric material to a level under the front substrate surface to form an isolation liner in the isolation opening and a dielectric liner in the contact opening; and depositing an electrically conductive material to at least fill the isolation opening and the contact opening to form a first conductive core in the isolation opening and a second conductive core in the contact opening, and the isolation liner and the dielectric liner partially surround the respective conductive cores.

* * * * *